United States Patent [19]
Tsai et al.

[11] Patent Number: 5,677,237
[45] Date of Patent: Oct. 14, 1997

[54] PROCESS FOR REMOVING SEAMS IN TUNGSTEN PLUGS

[75] Inventors: Nun-Sian Tsai, Hsinchu; Yung-Sheng Huang, Hsin-Chu, both of Taiwan

[73] Assignee: Taiwan Semiconductor Manufacturing Company Ltd., Hsin-chu, Taiwan

[21] Appl. No.: 667,696

[22] Filed: Jun. 21, 1996

[51] Int. Cl.$^6$ ............................................. H01L 21/44
[52] U.S. Cl. .................... 437/192; 437/195; 437/190; 437/203; 437/246
[58] Field of Search ................................. 437/192, 195, 437/190, 203, 246

[56] References Cited

U.S. PATENT DOCUMENTS

| | | | |
|---|---|---|---|
| 4,441,247 | 4/1984 | Gargini et al. | 437/41 GS |
| 4,532,702 | 8/1985 | Gigante et al. | 29/578 |
| 5,200,360 | 4/1993 | Bradbury et al. | 437/192 |
| 5,212,118 | 5/1993 | Saxena | 437/235 |
| 5,305,519 | 4/1994 | Yamamoto et al. | 29/852 |
| 5,332,691 | 7/1994 | Kinoshita et al. | 437/192 |
| 5,387,550 | 2/1995 | Cheffings et al. | 437/189 |
| 5,407,698 | 4/1995 | Emesh | 437/192 |
| 5,422,308 | 6/1995 | Nicholls et al. | 437/192 |
| 5,422,310 | 6/1995 | Ito | 437/192 |
| 5,502,008 | 3/1996 | Hayakawa et al. | 437/192 |
| 5,527,736 | 6/1996 | Huang et al. | 437/190 |
| 5,587,339 | 12/1996 | Wybom et al. | 437/195 |
| 5,622,894 | 4/1997 | Jang et al. | 438/643 |

*Primary Examiner*—Charles L. Bowers, Jr.
*Assistant Examiner*—Lynne A. Gurley
*Attorney, Agent, or Firm*—George O. Saile; Stephen B. Ackerman

[57] ABSTRACT

A method for fabricating seamless, tungsten filled, small diameter contact holes, has been developed. The process features initially creating a tungsten plug, in the small diameter contact hole, and filling or repairing, seams or voids in the tungsten plug, with an additional layer of selectively deposited tungsten.

26 Claims, 4 Drawing Sheets

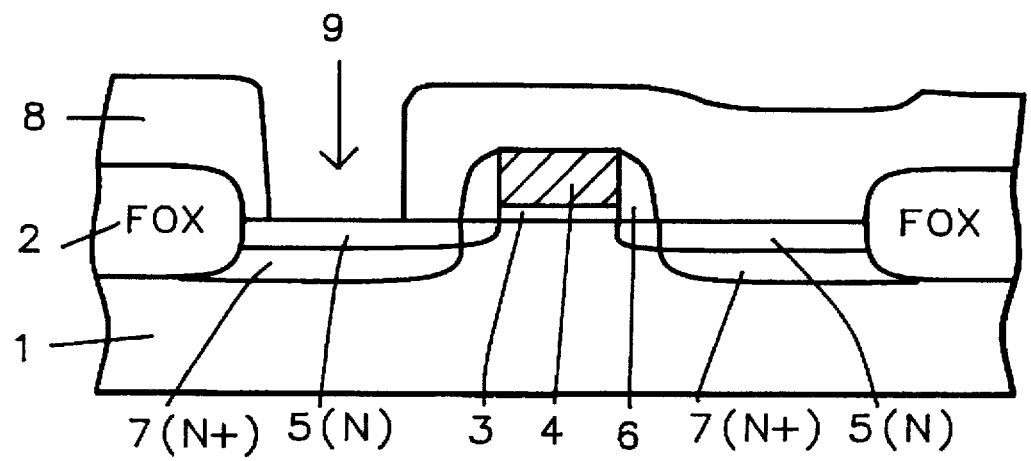
FIG. 1
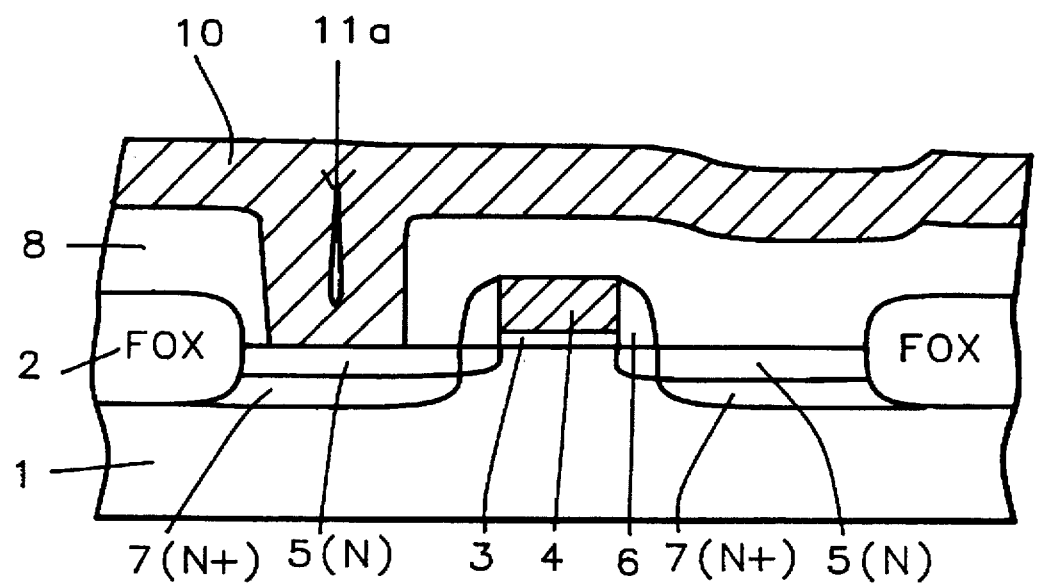
FIG. 2 - Prior Art

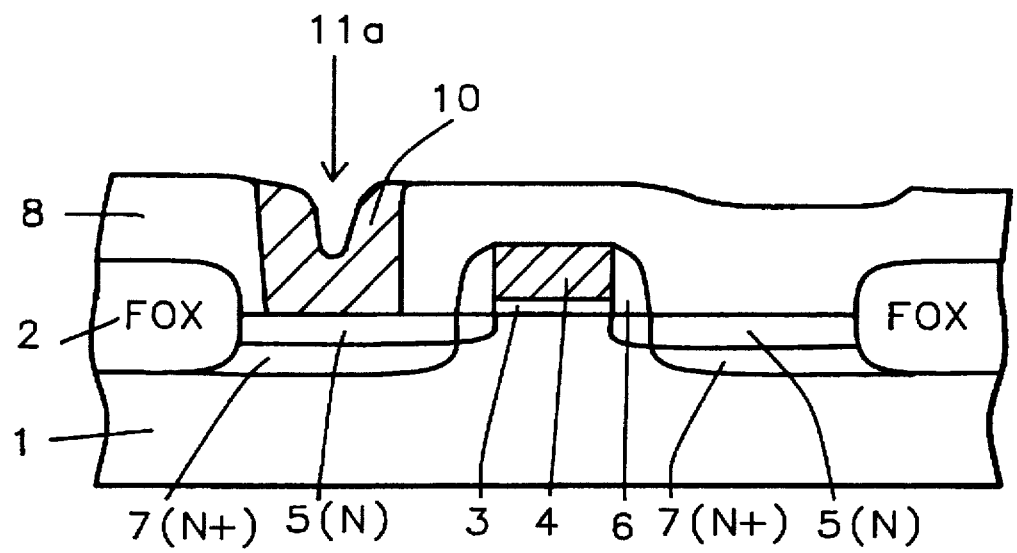
FIG. 3 – Prior Art
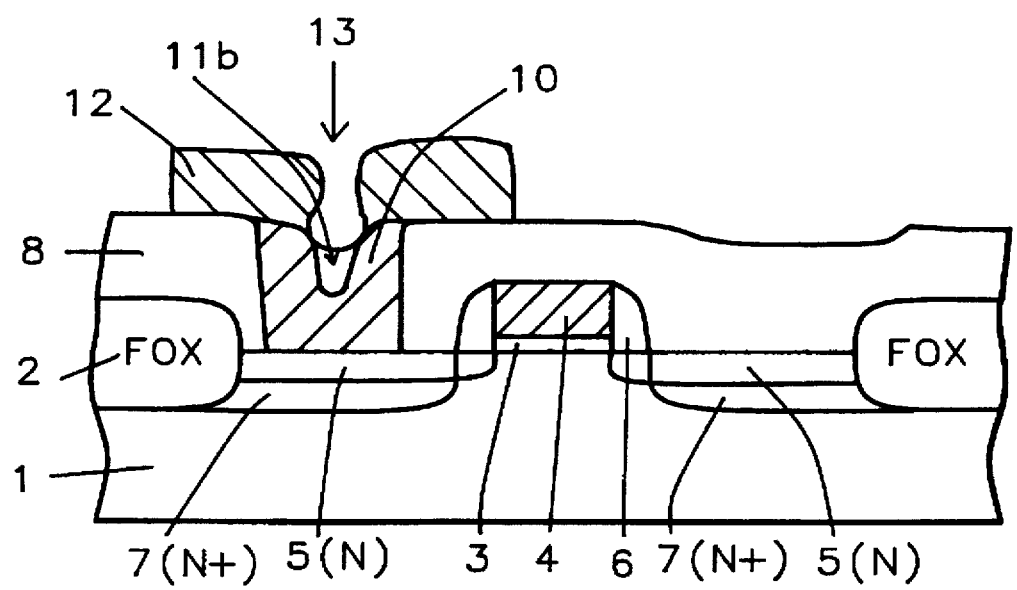
FIG. 4 – Prior Art

PROCESS FOR REMOVING SEAMS IN TUNGSTEN PLUGS

BACKGROUND OF THE INVENTION

(1) Field of the Invention

This invention relates to the fabrication methods used for semiconductor devices, and more specifically to an optimized tungsten stud process, used to interconnect active device regions to overlying metallizations.

(2) Description of Prior Art

The semiconductor industry is continually striving to increase the performance of semiconductor devices, while still attempting to reduce the cost of these higher performing devices. The trend to micro-miniaturazation, or the ability to produce semiconductor devices with sub-micron features, has allowed the increased performance and cost reduction objectives to be realized. The ability to fabricate silicon chips with sub-micron features has yielded higher performing devices, via reductions in performance degrading resistances and capacitances. In addition sub-micron features, resulting in smaller silicon chips, has allowed more silicon chips to be obtained from a specific size starting silicon wafer. Since the cost of processing the silicon wafer remains unchanged, the cost of a specific chip is reduced. Many semiconductor fabrication disciplines, such as photolithography and anisotropic, dry etching, have been major contributors to the realization of micro-miniaturazation. For example, more sophisticated exposure cameras, as well as more sensitive photoresist materials, have allowed sub-micron features to be routinely achieved in photoresist masking layers. In addition advances in selective, anisotropic, reactive ion etching procedures, have in turn allowed the sub-micron images in overlying photoresist masking layers, to be successfully transferred to underlying materials, used for fabrication of semiconductor devices.

However with the advent of micro-miniaturazation, specific silicon device structures and features become more vulnerable to yield and reliability problems. For example the higher aspect ratio of contact holes, and via holes, fabricated with sub-micron features, present problems when attempting to fill these deep, narrow diameter holes, using conventional metal deposition processes. In addition smaller contact and via holes place more stringent demands on the current carrying capabilities of the metal used to fill the sub-micron contact holes. Therefore a trend away from the use of aluminum based metallizations, to fill sub-micron contact and via holes, has occurred. The inability of sputtered aluminum to adequately fill the high aspect ratio contact holes, and the inability of aluminum to reliably sustain the higher, contact hole current densities, has led to the use of tungsten as a contact hole fill material. Tungsten offers greater current carrying capabilities then aluminum, and thus is less prone to electromigration reliability failures. In addition tungsten can be deposited using low pressure chemical vapor deposition, (LPCVD), processing, offering more conformal, contact hole filling, then aluminum counterparts, thus offering more yield potential. However even tungsten depositions, using LPCVD processes, can result in undesirable fill features. A basic characteristic of an LPCVD contact hole fill is by deposition of the metal on the sides of the deep, narrow contact hole. Sometimes at the completion of the metal fill, a seam or void is present at the point where the depositing metal, on the sides of the contact hole, meet. This void or seam has been observed for high aspect ratio contact holes, filled with tungsten. Subsequent exposure of the tungsten void or seam, to dry etching processes, used for patterning purposes, aggravates or increases the size of the void. This defect is transferred to subsequent metallizations, overlying the tungsten filled contact hole, resulting in possible electromigration, reliability problems.

This invention will describe a process for successfully filling high aspect ratio contact holes with tungsten, via the use a selective redeposition of tungsten used to fill voids or seams created with the initial LPCVD tungsten fill. Cheffings, et al, in U.S. Pat. No. 5,387,550, describe a process for filling voids or seams, in tungsten filled contact holes, with silicon. However that process requires the complexity and cost of using an etchback or planarazation process to remove silicon from unwanted regions. This invention will describe a selective tungsten deposition process, requiring no additional etchback or planarazation processing.

SUMMARY OF THE INVENTION

It is an object of this invention to provide a process for fabricating voidless, tungsten filled contact holes, to be used to connect active silicon device regions, in a semiconductor substrate, to an overlying metallization.

It is another object of this invention to initially deposit a tungsten layer, pattern the tungsten layer to create a tungsten plug, in a contact hole, and then deposit a second layer of tungsten.

It is yet another object of this invention to deposit the second layer of tungsten selectively on the exposed tungsten plug, in the contact hole.

It is still yet another object of this invention to use the selective tungsten deposition to fill the voids in the underlying tungsten plug.

In accordance with the present invention a process is described for fabricating voidless, tungsten filled contact holes, via use of a selective tungsten deposition, performed after formation of a tungsten plug. A contact hole is opened in a dielectric layer, to an active device region in a semiconductor substrate. A layer of titanium, to be used for adhesion and contact purposes, and a layer of titanium nitride, to be used as a barrier to protect underlying materials from subsequent process reactants, are deposited. Chemical vapor deposition of tungsten is next performed to fill the contact hole, followed by dry etching procedures, used to remove unwanted tungsten from all areas except from the tungsten filled contact hole. A selective tungsten deposition is next performed, depositing only on the exposed, underlying tungsten, in the contact hole, including deposition in any void or seam in the underlying tungsten fill. Interconnect metallization and patterning complete the process.

BRIEF DESCRIPTION OF THE DRAWINGS

The object and other advantages of this invention are best described in the preferred embodiment with reference to the attached drawings that include:

FIG. 1, which schematically, in cross-sectional style, shows a silicon device, at a stage prior to tungsten contact hole filling.

FIGS. 2–4, which schematically, in cross-sectional style, show prior art, in which fabrication sequences resulted in seams or voids, in the tungsten filled contact hole.

DESCRIPTION OF THE PREFERRED EMBODIMENTS

Figure 5:
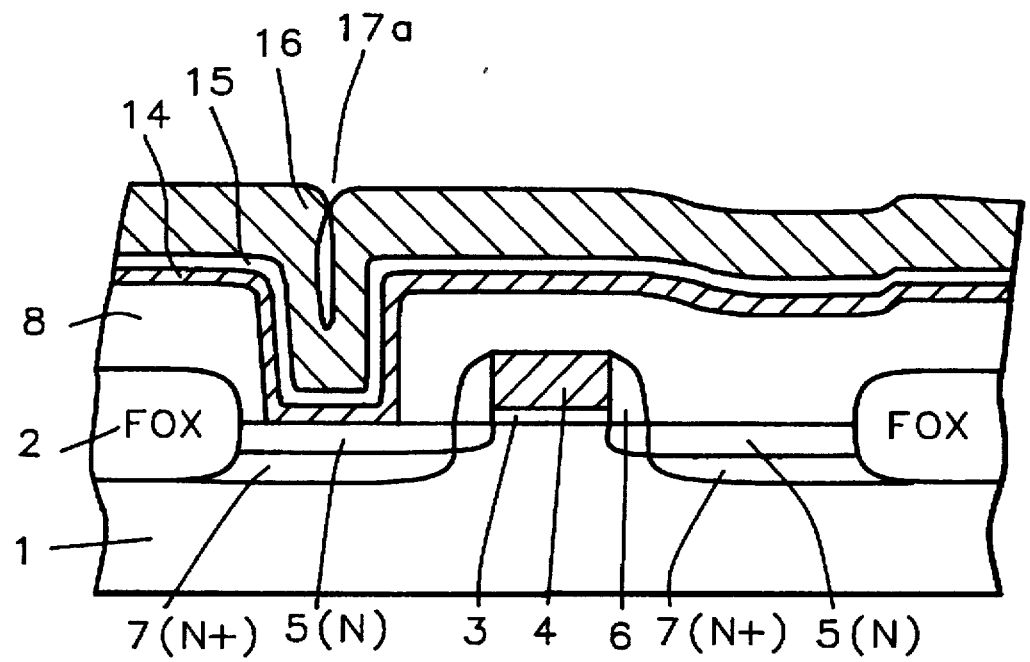
FIGS. 5–8, which schematically, in cross-sectional style, show the stages of fabrication, used to create voidless tungsten filled contact holes.

The method of creating voidless tungsten plugs, for contact hole fills, will now be covered in detail. This invention can be used as part of metal oxide semiconductor field effect transistors, (MOSFET), devices, that are currently being manufactured in industry, therefore only the specific areas unique to understanding this invention will be covered in detail.

FIG. 1, schematically shows a typical, N channel, (NFET), device, that contact holes, filled with voidless tungsten plugs, can be used with. A substrate, 1, composed of P type, single crystalline silicon, with a <100> crystallographic orientation, is used. Thick field oxide regions, 2, (FOX), are created, and used for isolation purposes. The FOX regions are produced by first patterning a silicon nitride-silicon dioxide, composite insulator, using conventional photolithographic and selective, anisotropic, reactive ion etching, (RIE), techniques. After photoresist removal, the composite insulator pattern is used as an oxidation mask to allow between about 4000 to 6000 Å Angstroms of silicon dioxide to be grown thermally, in non-masked regions. After removal of the oxidation masking composite insulator, using hot phosphoric acid for the overlying silicon nitride layer, and a buffered hydrofluoric acid solution for the underlying silicon dioxide layer, a thin silicon dioxide, gate insulator, 3, is grown in an oxygen-steam ambient, at a temperature between about 800° to 1000° C., to a thickness between about 50 to 300 Å Angstroms. A polysilicon layer is next deposited using low pressure chemical vapor deposition, (LPCVD), processing, at a temperature between about 500° to 700° C., to a thickness between about 1500 to 4000 Å Angstroms. The polysilicon can be grown using in situ doping techniques, via the addition of arsine or phosphine to a silane ambient. The polysilicon layer can also be deposited intrinsically, and doped via ion implantation of arsenic or phosphorous, at an energy between about 50 to 100 Kev., at a dose between about 1E15 to 1E16 atoms/cm$^2$. Standard photolithographic and RIE procedures, using Cl$_2$ as an etchant, are used to create polysilicon gate structure, 4, shown schematically in FIG. 1.

After photoresist removal, performed via plasma oxygen ashing, followed by wet cleans, an N type, lightly doped source and drain region, 5, is created via ion implantation of phosphorous, at an energy between about 30 to 60 Kev., at a dose between about 1E12 to 5E13 atoms/c$^2$. A silicon oxide layer is then deposited using either LPCVD or plasma enhanced chemical vapor deposition, (PECVD), processing, at a temperature between about 500° to 800° C., to a thickness between about 1500 to 4000 Å Angstroms, using tetraethylorthosilicate as a source. An anisotropic, RIE procedure, using CHF$_3$ as an etchant, is used to produce insulator sidewall spacer, 6, shown schematically in FIG. 1. Another ion implantation procedure, using arsenic at an energy between about 50 to 100 Kev., at a dose between about 1E14 to 5E15 atoms/c$^2$, is used to create heavily doped source and drain region, 7.

Another silicon oxide layer, 8, is deposited, again via use of either LPCVD or PECVD processing, at a temperature between about 500° to 800° C., to a thickness between about 3000 to 8000 Å Angstroms. Photolithography and RIE procedures, using CHF$_3$ as an etchant, are employed to open contact hole, 9, to expose heavily source and drain region, 7. The use of more aggressive designs, used to increase device performance, results in high aspect ratio contact holes. The depth of contact hole, 9, or the thickness of silicon oxide layer, 8, divided by the diameter of opening of contact hole, 9, which is between about 0.3 to 0.7 µM, result in a contact hole that can present problems when attempting to fill with conventional metal deposition procedures. FIG. 1, schematically shows this structure after photoresist removal, via plasma oxygen ashing, followed by careful wet cleans.

FIGS. 2–4, schematically represent prior art, and attempts at filling high aspect ratio contact holes, with conventional tungsten deposition procedures. FIG. 2, shows the result of an LPCVD deposition, using tungsten hexafluoride as a source, attempting to fill high aspect ratio, contact hole, 9, with tungsten. The deposition of tungsten layer, 10, is performed at a temperature between about 400° to 500° C., to a thickness between about 4000 to 10000 Å Angstroms. The filling of high aspect ratio, contact hole, 9, results from tungsten depositing on the sidewalls of contact hole, 9. At the conclusion of the deposition, it is possible that a seam, 11a, in the tungsten fill, can result due to a pinching, or closing effect, when the sidewall tungsten layers converge. Blanket, selective, reactive ion etching, using SF$_6$—Ar—O$_2$ as an etchant, to remove unwanted tungsten from areas other then the contact hole, can result in seam, 11a, evolving to an opening or void, 11b, shown schematically in FIG. 3. The deleterious consequence of opening 11b, is the inability of overlying interconnect metallizations, such as layer, 12, shown schematically in FIG. 4, to fill this opening, replicating opening 11b, with interconnect metallization opening, 13. The poor conformality of interconnect metallization structure, 12, can result in extremely high current densities in the thin regions of coverage, ultimately leading to electromigration failures. The possibility of electromigration failure is enhanced when the interconnect metallization structure is an aluminum based metallurgy, which is characterized by poor electromigration resistance properties.

Figure 6:
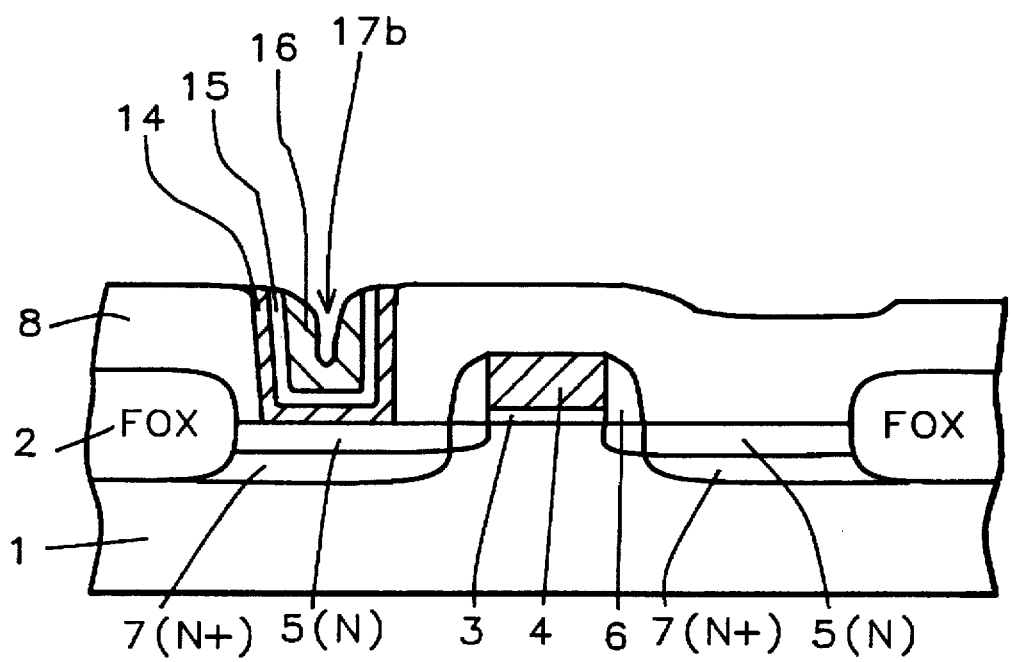

A process will now be described in which the deleterious seam or void in tungsten plugs, shown in prior art, is refilled with an additional, selective tungsten deposition. Again applying this invention to the structure depicted in FIG. 1, after a buffered hydrofluoric acid pre-clean, a layer of titanium, 14, is deposited using r.f. sputtering, to a thickness between about 200 to 500 Å Angstroms. The titanium layer, 14, shown in FIG. 5, is used as an effective contact to underlying source and drain region, 7, and also offers excellent adhesion to the silicon oxide sidewalls of contact hole, 9. A layer of titanium nitride, 15, is next deposited, again using r.f. sputtering, to a thickness between about 500 to 1000 Å Angstroms. The subsequent tungsten deposition produces reactants that can damage exposed titanium, therefore the titanium nitride layer performs as a barrier during the tungsten deposition. The tungsten layer, 16, is again deposited using LPCVD processing, using tungsten hexafluoride as a source, at a temperature between about 400° to 500° C., to a thickness between about 4000 to 10000 Å Angstroms. Again, as was previously shown in FIG. 2, a seam, 17a, in the center of the tungsten fill, in the contact hole, develops. This is shown in FIG. 5. Blanket, selective, RIE processing, performed using SF$_6$—Ar—O$_2$, used to remove unwanted tungsten from all regions, other then in the contact hole, again result in seam, 17a, developing into a larger seam, or void, 17b shown schematically in FIG. 6. Titanium nitride layer, 15, and titanium layer, 14, are removed using RIE processing, using BCl$_3$ and Cl$_2$ as an etchant.

Figure 7:
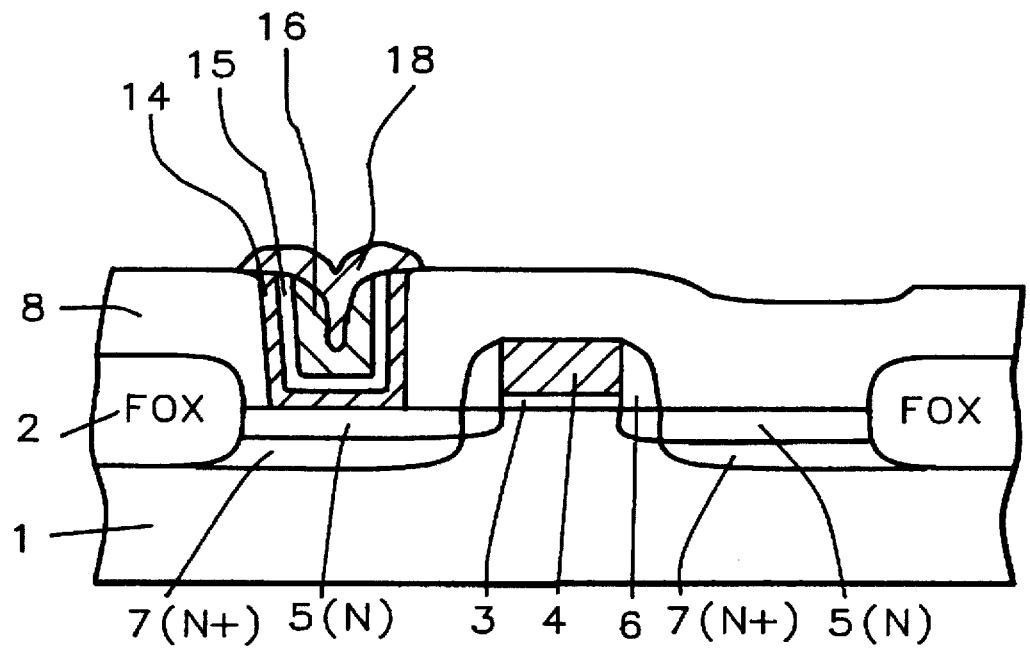

FIG. 7, shows the result of a process used to fill or close void, 17b. A preclean step, using buffered hydrofluoric acid, at a temperature between about 20° to 25° C., is performed, followed by a deposition of tungsten, 18, that selectively deposits only on exposed metal, or in this case the exposed tungsten fill, 16, in the contact hole. The selective tungsten deposition is performed using LPCVD processing, at a temperature between about 280° to 400° C., to a thickness between about 500 to 1000 Å Angstroms, using tungsten hexafluoride and hydrogen. If a cold wall deposition apparatus is used a hydrogen to tungsten hexafluoride ratio of about 20 is used, consisting of between about 1 to 3 liters/min., of hydrogen, to between about 0.05 to 0.15 liters/min., of tungsten hexafluoride. However if a hot wall deposition apparatus is used the hydrogen to tungsten hexafluoride ratio is increased to about 100. Since the deposition of tungsten is selective, removal of unwanted tungsten, from areas other then the contact hole, is not needed. However if the mushroom shaped tungsten fill, 18, is undesirable, photoresist application, followed by a non-selective RIE etchback process, can be employed to smooth the topography.

Figure 8:
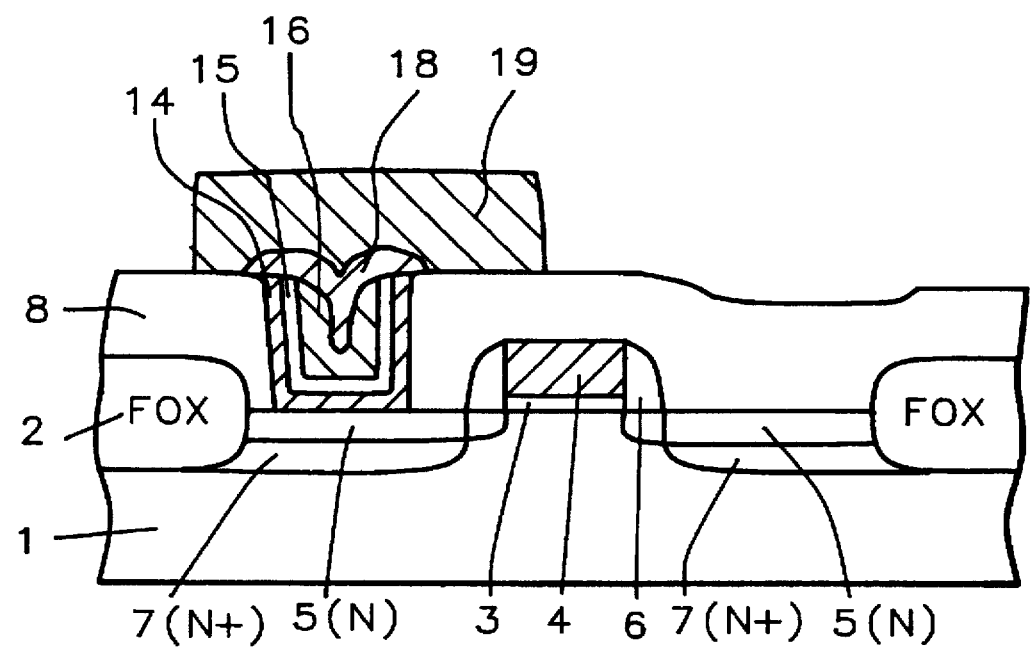

A metallization layer of aluminum, containing between about 0.5 to 3% copper, is deposited using r.f. sputtering, to a thickness between about 4000 to 6000 Å Angstroms. Conventional photolithographic and RIE processing, using $Cl_2$ as an etchant, is used to create metallization interconnect structure 19, shown in FIG. 8. The aluminum metallization structure, 19, unlike counterpart structure, 12, previously shown in FIG. 4, does not exhibit thinning or poor conformality. This is accomplished by aluminum deposition on a voidless, underlying tungsten structure, and offers more resistance to electromigration failures, as well as lower contact resistance, than counterpart structure, 12. Photoresist removal is again accomplished via plasma oxygen ashing, followed by careful wet cleans.

The process, although shown for tungsten fills, used to fill contact holes which connect an overlying interconnect metallization structure to an underlying active silicon device region, can also be applied to the use of tungsten to fill via holes, used to connect two levels of interconnect metallizations. In addition this process although shown as an application for a N channel, (NFET), device, can also be applied to P channel, (PFET), devices, complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a tungsten filled contact hole, to provide electrical contact between an underlying conductive region, in said semiconductor substrate, and an overlying interconnect metallization structure, comprising the steps of:

providing said underlying conductive region, comprised of a source and drain region in said semiconductor substrate;

depositing a dielectric layer on said semiconductor substrate, including deposition on said source and drain region;

applying a photoresist layer;

photolithographically processing to create an opening in said photoresist layer, exposing said dielectric layer, directly over a portion of said source and drain region:

anisotropically etching said dielectric layer, in said opening in said photoresist layer, to create a contact hole to said source and drain region;

removing said photoresist layer;

surface cleaning said source and drain region;

depositing an adhesive layer on a top surface said dielectric layer, on sides of said contact hole, and on said source and drain region;

depositing a barrier layer on said adhesive layer;

depositing a first metal layer, on said barrier layer, filling said contact hole;

removing said first metal layer, removing said barrier layer, and removing said adhesive layer, from said top surface of said dielectric layer, forming a metal plug of said first metal layer, of said barrier layer, and of said adhesive layer, in said contact hole;

surface cleaning said metal plug;

selectively depositing a second metal layer, comprised of the same type as said first metal layer, only on the surface of said metal plug, in said contact hole, including the selective deposition, of said second metal layer, filling any voids that may exist in said metal plug after said first metal layer, said barrier layer and said adhesive layer have been removed from said top surface of said dielectric layer;

depositing a interconnect metallization layer on said dielectric layer, and on said second metal layer, in said contact hole; and patterning said interconnect metallization layer, to form a metal interconnect structure.

2. The method of claim 1, wherein said underlying conductive region, in said semiconductor substrate, can be an N type, heavily doped source and drain region, of a MOSFET device.

3. The method of claim 1, wherein said underlying conductive region, in said semiconductor substrate, can be a metal interconnect structure.

4. The method of claim 1, wherein said dielectric layer is silicon oxide, deposited using LPCVD or PECVD processing, at a temperature between about 500° to 800° C., to a thickness between about 3000 to 8000 Å Angstroms.

5. The method of claim 1, wherein said contact hole is formed via anisotropic, RIE processing, using $CHF_3$ as an etchant, with said contact hole having an opening with a diameter between about 0.3 to 0.7 µM, resulting in aspect ratios between about 1 to 3.

6. The method of claim 1, wherein said adhesive layer is titanium, deposited using r.f. sputtering, to a thickness between about 200 to 500 Å Agstroms.

7. The method of claim 1, wherein said barrier layer is titanium nitride, deposited using r.f. sputtering, to a thickness between about 500 to 1000 Å Angstroms.

8. The method of claim 1, wherein said first metal layer is tungsten, deposited using LPCVD processing, at a temperature between about 400° to 500° C., to a thickness between about 4000 to 10000 Å Angstroms.

9. The method of claim 1, wherein removal of said first metal layer, said barrier layer, and said adhesive layer, from said top surface of said dielectric layer, forming said metal plug, in said contact hole, is performed using RIE processing, using $SF_6$—Ar—$O_2$ as an etchant for said first metal layer, and $Cl_2$—$BCl_3$ as an etchant for said barrier layer and said adhesive layer.

10. The method of claim 1, wherein said surface cleaning of said metal plug is performed using a buffered hydrofluoric acid solution, at a temperature between about 20° to 25° C.

11. The method of claim 1, wherein said second metal layer is tungsten, deposited selectively on the surface of said metal plug, via LPCVD processing, at a temperature between about 280° to 400° C., to a thickness between about 500 to 1000 Å Angstroms, using a cold wall apparatus with a tungsten hexafluoride flow between about 0.05 to 0.15 liters/min., and a hydrogen flow between about 1 to 3 liters/min.

12. The method of claim 1, wherein said second metal layer is tungsten, deposited selectively on said surface of said metal plug, via LPCVD processing, at a temperature between about 300° to 400° C., to a thickness between about 500 to 1000 Å Angstroms, using a hot wall apparatus with an ambient flow ratio of hydrogen to tungsten hexafluoride, of about 100.

13. The method of claim 1, wherein said interconnect metallization layer is aluminum, containing between about 0.5 to 3% copper, deposited using r.f. sputtering, to a thickness between about 4000 to 6000 Å Angstroms.

14. A method for fabricating a MOSFET device, on a semiconductor substrate, using two layers of tungsten to fill a contact hole, used to provide electrical contact between an underlying conductive region, in said semiconductor substrate, and an overlying interconnect metallization structure, comprising the steps of:

providing said underlying conductive region, comprised of a source and drain region, in said semiconductor substrate;

depositing a dielectric layer on said semiconductor substrate, including deposition on said source and drain region;

applying a photoresist layer;

photolithographically processing to open a region in said photoresist layer, exposing a portion of said dielectric layer, directly over said source and drain region;

anisotropically etching said dielectric layer, in said, opened region, in said photoresist layer, to create a contact hole, to said source and drain region;

removing said photoresist layer;

surface cleaning said source and drain region;

depositing a titanium layer on a top surface said dielectric layer, on sides of said contact hole, and on said source and drain region;

depositing a titanium nitride layer on said titanium layer;

depositing a first tungsten layer, on said barrier layer, filling said contact hole;

removing said first tungsten layer, removing said titanium nitride layer, and removing said titanium layer, from said top surface of said dielectric layer, forming a tungsten plug in said contact hole, consisting of said first tungsten layer, of said titanium nitride layer, and of said titanium layer;

surface cleaning said tungsten plug;

selectively depositing a second tungsten layer only on the surface of said tungsten plug, in said contact hole, including selective deposition of said second tungsten layer, in regions of said tungsten plug where voids may exist after said first tungsten layer, said titanium nitride layer and said titanium layer have been removed from said top surface of said dielectric layer;

depositing an interconnect metallization layer on said dielectric layer, and on said second tungsten layer, in said contact hole; and patterning said interconnect metallization layer, to form a metal interconnect structure.

15. The method of claim 14, wherein said underlying conductive region, in said semiconductor substrate, can be an N type, heavily doped source and drain region, of a MOSFET device.

16. The method of claim 14, wherein said underlying conductive region, in said semiconductor substrate, can be a metal interconnect structure.

17. The method of claim 14, wherein said dielectric layer is silicon oxide, deposited using either LPCVD or PECVD processing, at a temperature between about 500° to 800° C., to a thickness between about 3000 to 8000 Å Angstroms.

18. The method of claim 14, wherein said contact hole is formed via anisotropic, RIE processing, using $CHF_3$ as an etchant, with said contact hole having a small diameter opening between about 0.3 to 0.7 μM, resulting in aspect ratios between about 1 to 3.

19. The method of claim 14, wherein said titanium layer is deposited using r.f. sputtering, to a thickness between about 200 to 500 Å Angstroms.

20. The method of claim 14, wherein said titanium nitride is deposited using r.f. sputtering, to a thickness between about 500 to 1000 Å Angstroms.

21. The method of claim 14, wherein said first tungsten layer is deposited using LPCVD processing, at a temperature between about 400° to 500° C., to a thickness between about 4000 to 10000 Å Angstroms.

22. The method of claim 14, wherein removal of said first tungsten layer, of said titanium nitride layer, and of said titanium layer, from said top surface of said dielectric layer, used to form said tungsten plug, in said contact hole, is accomplished using RIE processing, using $SF_6$—Ar—$O_2$ as an etchant for said first tungsten layer, and $BCl_3$—$Cl_2$ as an etchant for said titanium nitride layer, and for said titanium layer.

23. The method of claim 14, wherein said surface cleaning of said tungsten plug is performed using a buffered hydrofluoric acid solution, at a temperature between about 20° to 25° C.

24. The method of claim 14, wherein said second tungsten layer is deposited selectively on the surface of said tungsten plug, via LPCVD processing, at a temperature between about 280° to 400° C., to a thickness between about 500 to 1000 Å Angstroms, using a cold wall apparatus with a tungsten hexafluoride flow between about 0.05 to 0.15 liters/min., and a hydrogen flow between about 1 to 3 liters/min.

25. The method of claim 14, wherein said second tungsten layer is deposited selectively on the surface of said tungsten plug, via LPCVD processing, at a temperature between about 300° to 400° C., to a thickness between about 500 to 1000 Å Angstroms, using a hot wall apparatus with a ambient flow ratio of hydrogen to tungsten hexafluoride, of about 100.

26. The method of claim 14, wherein said interconnect metallization layer is aluminum, containing between about 0.5 to 3% copper, deposited using r.f. sputtering, to a thickness between about 4000 to 6000 Å Angstroms.

* * * * *